United States Patent
Goel

(10) Patent No.: US 7,362,801 B2
(45) Date of Patent: Apr. 22, 2008

(54) METHOD FOR ACCURATE ESTIMATION OF NOISE FOR DATA MODEMS

(75) Inventor: Nagendra K. Goel, McLean, VA (US)

(73) Assignee: LSI Logic Corporation, Milpitas, CA (US)

( * ) Notice: Subject to any disclaimer, the term of this patent is extended or adjusted under 35 U.S.C. 154(b) by 670 days.

(21) Appl. No.: 10/739,388

(22) Filed: Dec. 18, 2003

(65) Prior Publication Data

US 2005/0135466 A1    Jun. 23, 2005

(51) Int. Cl.
H04B 3/46      (2006.01)
H04B 1/38      (2006.01)
G05B 15/00     (2006.01)

(52) U.S. Cl. .................. 375/227; 375/222; 700/262
(58) Field of Classification Search ........... 375/222, 375/227, 278, 285, 347; 704/233; 702/94; 700/262
See application file for complete search history.

(56) References Cited

U.S. PATENT DOCUMENTS

| | | | | |
|---|---|---|---|---|
| 4,905,286 A * | 2/1990 | Sedgwick et al. | ........ | 704/233 |
| 5,561,611 A * | 10/1996 | Avinash | ........ | 702/111 |
| 6,005,893 A * | 12/1999 | Hyll | ........ | 375/260 |
| 6,122,325 A * | 9/2000 | Mogre et al. | ........ | 375/261 |
| 6,246,717 B1 * | 6/2001 | Chen et al. | ........ | 375/226 |
| 6,292,519 B1 * | 9/2001 | Popovic | ........ | 375/346 |
| 6,317,456 B1 * | 11/2001 | Sayeed | ........ | 375/227 |
| 6,393,257 B1 * | 5/2002 | Holtzman | ........ | 455/67.13 |
| 6,760,370 B2 * | 7/2004 | Li et al. | ........ | 375/227 |
| 7,027,496 B2 * | 4/2006 | Tapaninen | ........ | 375/227 |
| 2002/0171586 A1 * | 11/2002 | Martorana et al. | ........ | 342/458 |
| 2003/0101026 A1 * | 5/2003 | Rabinowitz et al. | ........ | 702/189 |
| 2003/0115007 A1 * | 6/2003 | Lipp | ........ | 702/94 |
| 2004/0230383 A1 * | 11/2004 | Bechhoefer et al. | ........ | 702/57 |

* cited by examiner

Primary Examiner—Mohammed Ghayour
Assistant Examiner—Lawrence Williams
(74) Attorney, Agent, or Firm—Trexler Bushnell Giangiorgi & Blackstone Ltd.

(57) ABSTRACT

Noise and signal-to-noise ratio (SNR) estimation are relatively straightforward tasks. However, when SNR is small, systematic errors in measurement may result in over-estimation of SNR, which also occurs during runtime monitoring of SNR. Here, sufficient numbers of bits have been preassigned to each channel using QAM modulation scheme. Therefore, SNR relative to QAM lattice size depends on the noise margin and the desired (bit error rate) BER. If a relatively small margin is desired, similar measurement errors may result in over-estimation of SNR. Another problem that arises is that the variance of the noise estimator is relatively high. Therefore, SNR estimates may vary by several dB, and there is only 50% confidence in the usual estimators that the actual SNR value will not be worse than that estimated. Thus, a computationally efficient method for SNR estimation that also allows for specification of a confidence level in the estimates is provided.

7 Claims, 4 Drawing Sheets

---

Defining a Pre-determined Limit of a Calculated Variance

↓

Collecting Data Having Said Calculated Variance

↓

Applying a Correction Factor to Said Calculated Variance Every Time Said Calculated Variance is More Than Said Pre-determined Limit

↓

Deriving a True Variance of the Data by Using Curve Fitting

METHOD FOR ACCURATE ESTIMATION OF NOISE FOR DATA MODEMS

COPYRIGHT NOTICE

A portion of the disclosure of this patent application contains material which is subject to copyright protection. The copyright owner has no objection to the facsimile reproduction by anyone of the patent document or the patent disclosure, as it appears in the United States Patent and Trademark Office patent file or records, but otherwise reserves all copyright rights whatsoever.

BACKGROUND OF THE INVENTION

The present invention generally relates to a method for accurate estimation of the noise and, therefore, the signal-to-noise ratio (SNR) for communication channels. SNR is an important parameter for the data communication channel, as it determines the channel capacity. The present invention also describes how the method applies to ADSL data modems.

Noise and signal-to-noise ratio (SNR) estimation are considered relatively straightforward tasks. However, when the SNR is small, significant systematic errors in measurement may result in over-estimation of SNR. A similar situation arises during runtime monitoring of the SNR. At this time, sufficient numbers of bits have already been assigned to each channel using QAM modulation scheme. Therefore, the SNR relative to the QAM lattice size depends on the noise margin and the desired bit error rate (BER). If a relatively small margin is desired, similar measurement errors may result in over-estimation of SNR. An additional problem that arises in these conditions is that the variance of the noise estimator (which is a Chi-Squared random variable under Gaussian assumptions) is relatively high. Therefore, the SNR estimates may vary by several dB, and there is typically only 50% confidence in the usual estimators that the actual SNR value will not be worse than that estimated.

FIG. 1 illustrates a simplified block diagram of an ADSL modem receiver 20, showing all the components of noise estimation. Typically, each symbol transmitted in such a system is first passed through a time domain equalizer (TEQ) 22, which is typically a linear filter designed for the purpose of minimizing inter-symbol interference. Then, the time series data is converted into a time series of vectors (or multiple channels), by taking a fourier transform 24 of the samples. A frequency equalizer (FEQ) 26 scales and rotates the complex FFT vectors so that they fall on the constellation points on the N-QAM modulation. Finally, the location of the signal is compared to the nearest constellation point (example of 4QAM is illustrated in FIG. 2), and the difference is taken as the noise for that channel. The noise and the signal-to-noise ratio (SNR) are measured using different setups during different stages of training. Initially, there is no information about the channel, and an initial trivial estimate of the TEQ and FEQ 26 are used. A 4-QAM periodic signal is used to establish timing recovery, and then to obtain the TEQ and FEQ filters. During this phase, trellis decoding is not active. For the purposes of SNR estimation, the signal is quantized to the nearest constellation point. The process is illustrated in FIG. 2.

The constellation points 30 are shown as the dark squares. The dots 32 are the data points belonging to the first quadrant. The pluses 34 are data points belonging to the second quadrant. However, when the noise is high, the signal crosses the lattice boundaries resulting in a detection error, and lower estimated noise. In this example, data signals in the shaded region 36 are ignored (or termed as erasures, indicating that they do not count towards a valid measurement). However, if the data signal is in the un-shaded region 38, first, it is quantized to the nearest constellation point 30. For example, a "plus" that has traveled from second quadrant to the first quadrant will be assumed to be arising from the first quadrant. The squared distance between the data and the nearest constellation point 30 serves as a measure of noise. An average is taken over a number of samples to get the average SNR. This causes a detection error (that will probably be corrected by the upper layers of the communication protocol), and in addition, it causes an error in the SNR estimation. Because of this reason, the SNR would be consistently over-estimated.

Once the proper TEQ and FEQ filters are in place and the cyclic prefix is introduced, the trellis decoding is turned off, or left off, based on the negotiated parameters between the modem and the DSLAM. However, still, in order to save memory, and in order to avoid latencies of the viterbi decoder, the SNR is typically measured using the quantization scheme described above. When higher order constellations are used, what matters for the purposes of measurement is not the overall SNR, but the relationship of the noise to Lattice size, that also governs the bit error rate and the noise margin. Therefore, the measurements get affected even at higher overall SNR.

An illustration of the consequences 40 for an ADSL modem is shown in FIG. 3, which is a simulation of downstream SNR measurement for 17.5 K feet loop with 150 feet bridge tap. Since noise outside the constellation points is either ignored or measured small due to neighboring constellation point, the measured SNR 42 is higher than the actual SNR 44. Errors in SNR measurement result in conservative design techniques such as use of a high noise margin.

The plot illustrated in FIG. 3 is derived through simulation of the ADSL handshake process. The X-axis 46 plots the various frequency bins. In each frequency bin, the SNR 42 is measured using the four QAM method, and plotted against the real SNR value 44 (as would be measured with prior information of constellation points). The calculated SNR 42 is generally higher than the real SNR 44, especially for SNR values below 10 dB. Around these SNR levels, there is also a larger tendency to see erasures 48, as the noise is larger than the constellation size. Another problem that can be inferred from this simulation is the variability in the estimates. As the SNR gets low, the variability in the measurement increases. Therefore, one has to follow more conservative schemes of allocating sufficient margins. Under such situations, it is more desirable to have an SNR estimate, such that one can be reasonably sure that the actual SNR is better than that value, without significantly underestimating the SNR.

Thus, basically, the existing problem is that when the signal to noise ratio is relatively small compared to the constellation size in a communication channel, there is a systematic error in estimation of the SNR. The only other known solution is to keep a record of all the data, and then use the expectation maximization algorithms to calculate the parameters for the mixture of gaussians. This one known solution, however, has its disadvantages, namely it needs too much computation and data storage.

The present invention, therefore, provides a simple solution to the problem of SNR measurement and a method to incorporate a level of confidence in the SNR estimates.

Therefore, an improved method for accurate estimation of noise for data modems is needed. The present invention provides such an improved method and explores a computationally efficient method for SNR estimation that also allows for specification of a confidence level in the estimates. The method of the invention solves the problem by incorporating information about the structure of the problem, and the collected statistic into the solution. Features and advantages of the present invention will become apparent upon a reading of the attached specification, in combination with a study of the drawings.

OBJECTS AND SUMMARY OF THE INVENTION

A primary object of an embodiment of the invention is to provide a fast and effective method to ensure a degree of confidence that the actual SNR is better than that which is calculated.

Another primary object of an embodiment of the invention is to solve the problem of bit errors caused due to OverEstimation of SNR.

An object of an embodiment of the invention is to provide a method which does not modify the existing methods of measurement.

Another object of an embodiment of the invention is to provide a correction made to the existing method, based on curve fitting.

Another object of an embodiment of the invention is to provide SNR/variance adjustment curved are derived based upon the amount of data, and target desired degree of confidence method.

Yet another object of an embodiment of the invention is to provide a method which may be used for any method that involves estimation of SNR from the transmitted data in a digital communication channel.

Briefly, and in accordance with at least one of the foregoing, an embodiment of the present invention provides a method for accurate estimation of noise for data modems. Noise and signal-to-noise ratio (SNR) estimation are considered relatively straightforward tasks. However, when the SNR is small, significant systematic errors in measurement may result in over-estimation of SNR. Similar situation arises during runtime monitoring of the SNR. At this time, sufficient numbers of bits have already been assigned to each channel using QAM modulation scheme. Therefore, the SNR relative to the QAM lattice size depends on the noise margin and the desired (bit error rate) BER. If a relatively small margin is desired, similar measurement errors may result in over-estimation of SNR. An additional problem that arises in these conditions is that the variance of the noise estimator (which is a Chi-Squared random variable under Gaussian assumptions) is relatively high. Therefore, the SNR estimates may vary by several dB, and there is only 50%.confidence in the usual estimators that the actual SNR value will not be worse than that estimated. Thus, a computationally efficient method for SNR estimation that also allows for specification of a confidence level in the estimates is provided.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which.

DETAILED DESCRIPTION OF THE ILLUSTRATED EMBODIMENT

Figure 1:
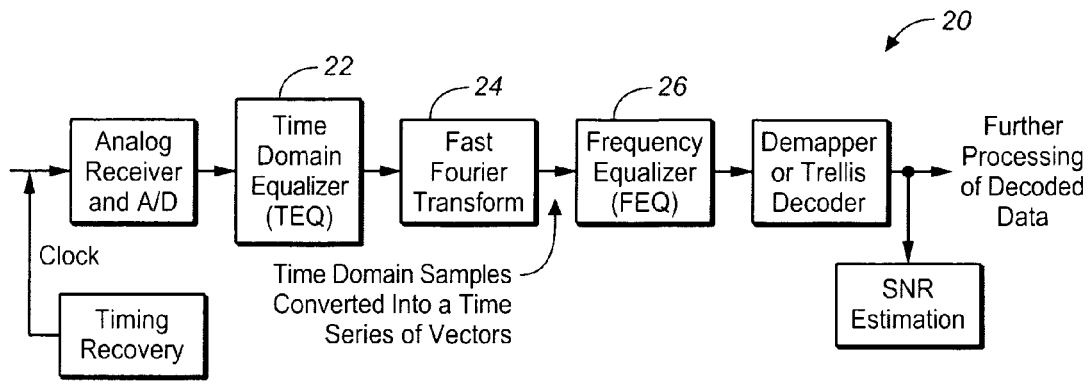
FIG. 1 is a block diagram illustrating a simplified structure of a multi-tone receiver, indicating the location of the module responsible for SNR measurement.
Figure 2:
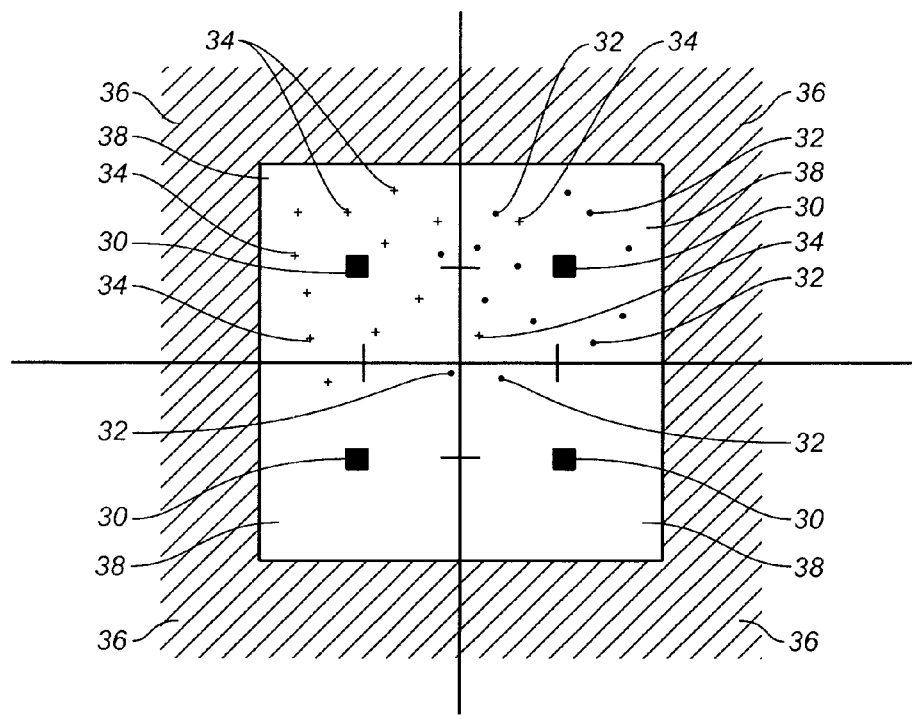
FIG. 2 illustrates a 4-QAM constellation and the process of quantization.
Figure 3:
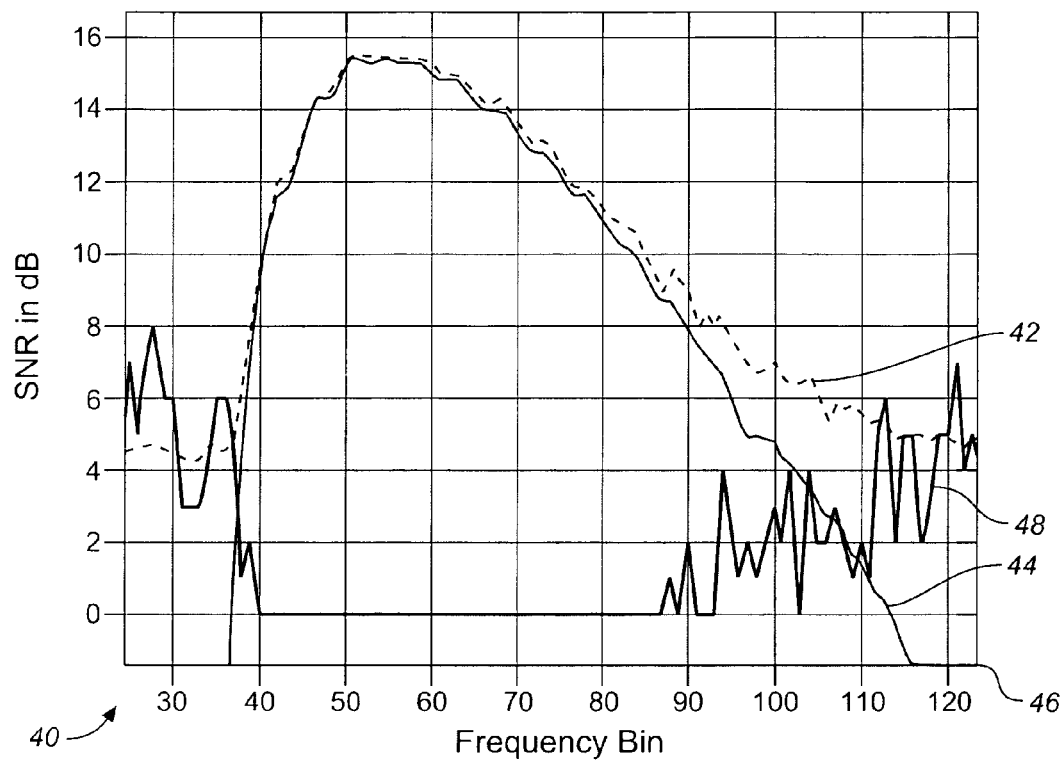
FIG. 3 illustrates a plot of the consequences for an ADSL modem.

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated and described herein.

Given a lattice structure, one could employ several methodologies to derive an estimate for the noise power. Two such methodologies are outlined herein, without delving into the mathematical details. One method would be to place the problem in maximum-likelihood framework. The variance estimator $$S = \sigma^2 = \frac{\sum_{i=1}^{N}(x_i - \bar{x}_i)^2}{N}$$

where N is the total number of samples, $\bar{x}_i$ is the sample average for that particular observation, and $x_i$ are the individual sample values, is a maximum likelihood estimator. That means that this estimate of the variance maximizes the likelihood of the observed data, when the mean $\bar{x}_i$ is known. For a 4QAM constellation, $\bar{x}_i$ will take one of four known values that should be known a priori. However, if $\bar{x}_i$ assignment were not known a priori, one would consider that as another probabilistic unknown, when deriving the likelihood. The mechanics of such estimation methods have been treated in detail in various works, such as A. P. Dempster N. M. Laird and D. B. Rubin, "Maximum Likelihood from Incomplete Data via the EM algorithm" Journal of the Royal statistical Society, Series B, 39(1): 1-38, 1977, and McLachlan, Krishnan, "The EM Algorithm and Extensions", Wiley, New York, 1997, and essentially result in the use of an iterative expectation-maximization algorithm. Such an algorithm is computationally expensive, and requires storage of all the data points.

Figure 8:
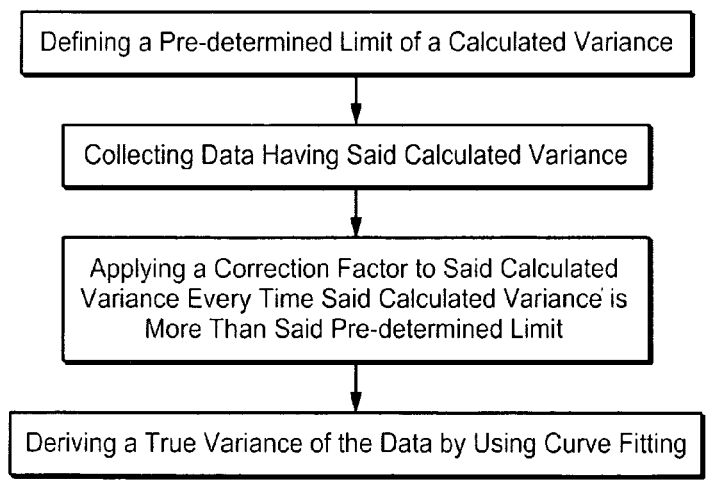
FIG. 8 illustrates a flow chart of the method of performing the invention.

Another approach would be to empirically derive the relationship between the actual and measured values of S. Based on an assumed value of σ one could write down the distribution function of the data and partition it along the constellation boundary. Then by integrating the estimator with the distribution to get (for a 4QAM constellation)

$$E(S) = 0.25 * \sum_{i=1}^{4} \int f_i(x)(x - c(x))^2 dx$$

where c(x) is the nearest constellation point to x. $f_i(x)$ are the gaussian distributions for each of the constellation points. This approach again poses two problems. First is that the equation does not have a closed form solution in terms of simple functions. The second problem is that it does not provide a means to incorporate a degree of confidence into the estimator. Therefore, these two approaches have been abandoned in favor of a new and novel approach or method 200 which is based upon Monte Carlo Simulation and curve fitting, and which is illustrated in FIG. 8.

Figure 4:
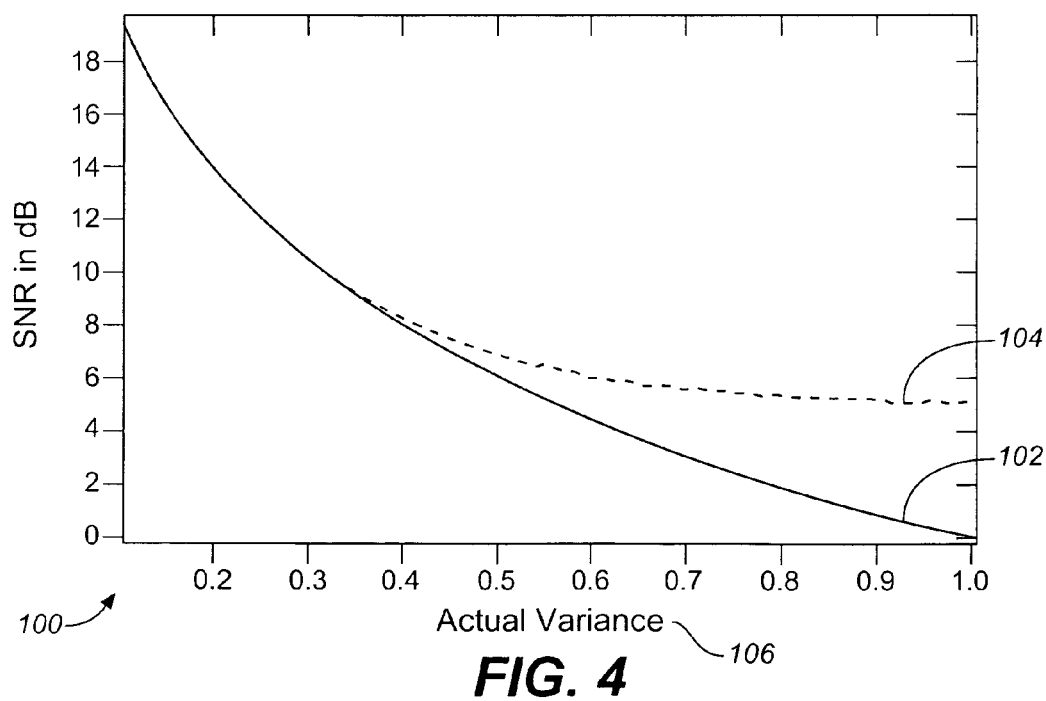
FIG. 4 illustrates a Monte Carlo simulation of SNR estimation for 4-QAM data.

A Monte Carlo simulation of SNR estimation for 4-QAM data 100 is illustrated in FIG. 4. FIG. 4 shows the effect of underestimating the variance on actual SNR 102, as a function of variance. As the SNR drops below 10 dB, there is a significant difference between the real and the estimated SNR 102, 104. In this case, since the signal strength is 2, the SNR can be written as $$SNR = 10\log\left(\frac{2}{\hat{\sigma}^2}\right)$$

Ten thousand data points were generated in order to get each of the measured values. The estimated value here does not correct for constellation wandering and erasures. As the SNR drops below 10.0 db, the estimated SNR 104 is much higher than the real SNR 102. When the real SNR 102 is around 0 db, the estimated SNR 104 is still around 5.5 dB.

Figure 5:
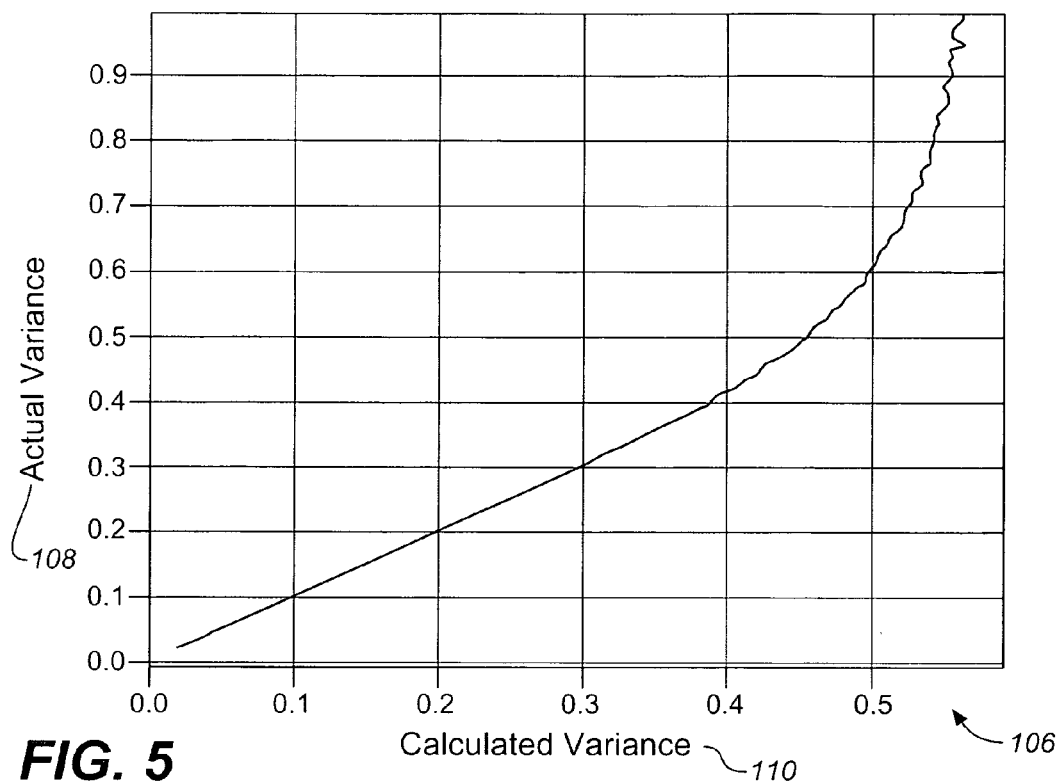
FIG. 5 illustrates a plot indicating how the actual variance depends on the calculated variance.
Figure 6:
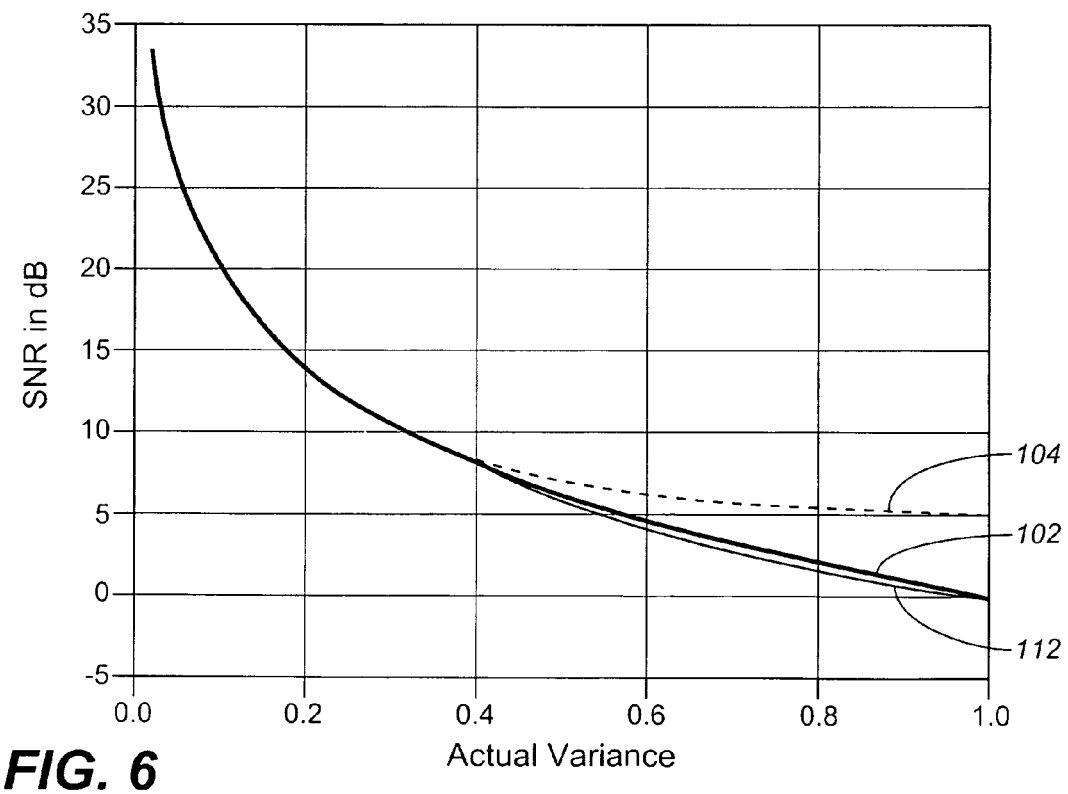
FIG. 6 illustrates a plot of the calculation of adjusted SNR by polynomial curve fitting.

A plot 106 indicating how the actual variance 108, which is plotted along the Y-axis, depends on the calculated variance 110, which is plotted along the X-axis, is illustrated in FIG. 5. Since it is known a priori that the variance estimates for low SNR are going to be incorrect, a correction factor is applied to the calculated variance 110, every time the calculated variance 110 is more than a pre-determined limit. The limit chosen, and the method chosen to make the adjustment, depends on the accuracy to which it is desired to measure SNR, as well as the computational resources available. The problem, thus, essentially boils down to that of curve fitting. One could use table lookup, or splines or polynomial curve fitting. Preferably polynomial curve fitting is used to derive the true variance of the data. Polynomial fit was applied only to variances that were above 0.4. Applying curve fitting to data that had a calculated variance of more than 0.4 with a $5^{th}$ order polynomial fit resulted in the following equation:

If $S_{calc} > 0.16$ $S_{adj} = 2.139e4 S_{calc}^5 - 2.018e4 S_{calc}^4 + 7443 S_{calc}^3 - 1329 S_{calc}^2 + 115.7 S_{calc} - 3.816$ If $S_{calc} \leq 0.16$ $S_{adj} = S_{calc}$ Here $S_{calc}$ is the calculated variance 104 that is performed using the usual method of variance calculation. $S_{adj}$ is the adjusted variance 112, that takes into account the constellation structure. The result of such a data fit is shown in FIG. 6. FIG. 6 illustrates the calculation of adjusted SNR 112 by polynomial curve fitting. Note that the adjustment would be applied only under low SNR conditions, and the additional computation introduced is negligible compared to other techniques such as the EM algorithm. Also note that extremely low SNR are also not of much interest as those channels would have an unacceptable bit error rate.

Figure 7:
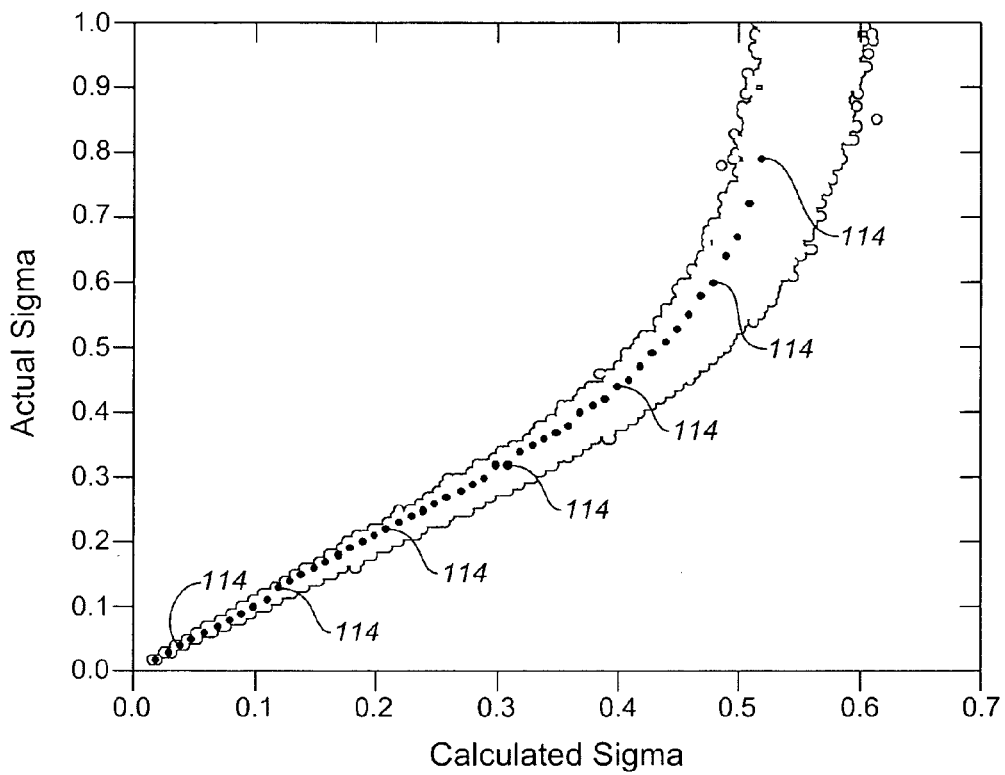
FIG. 7 illustrates a plot of the results for variance calculation simulation.

In the simulations discussed above, ten thousand data samples were used to calculate each of the variance parameters. However, typically, very little data is available for estimation, and the variance estimation is not very accurate. For example, an experiment is run where each variance is calculated using only 256 data points. Each experiment is repeated one thousand times to get a clear picture of what would happen if the data were too little. The results for variance calculation simulation are shown in FIG. 7. FIG. 7 illustrates that with limited data, actual variance cannot be known accurately, where the black dots 114 indicate 90% confidence levels that the actual variance is less than that value. As the variance of the signal increases, so does the error in variance estimation. Therefore, there is a greater chance the true SNR 102 would be significantly lower than the calculated SNR 104, and therefore cause unwanted errors on the channel. This makes it necessary to intentionally over-estimate the noise a little, in order to provide a level of confidence in the estimates. The black dots 114 indicate 90% confidence curve that the actual variance is less than the indicated value. The plot is derived by taking all the values of calculated SNR 104 in the region of interests, plotted along the X-axis, and then choosing a 90-percentile mark for the corresponding actual σ 104, plotted along the Y-axis. In this case, it is noticed that a correction is needed even for values as low as 0.2 (or in terms of SNR, in the range of 12-13 dB).

Using a fifth order polynomial fit to the standard deviation, the recommended correction is as follows:

If $0.53 > \sigma_{calc} > 0.1$ $\sigma_{adj} = 97.27 \sigma_{calc}^5 - 100.4 \sigma_{calc}^4 + 38.52 \sigma_{calc}^3 - 6.633 \sigma_{calc}^2 + 1.543 \sigma_{calc} - 0.01304$ If $\sigma_{calc} \leq 0.4$ $\sigma_{adj} = \sigma_{calc}$ If the calculated standard deviation is greater than 0.53, it is assumed that the channel is too noisy and the SNR is set to 0 dB.

By applying these corrections, one could state with 90% confidence level that the SNR has not been overestimated.

Thus, the method 200 generally includes the step 202 of defining a pre-determined limit of a calculated variance; the step 204 of collecting data having said calculated variance; the step 206 of applying a correction factor to said calculated variance every time said calculated variance is more than said pre-determined limit; and the step 208 of deriving a true variance of the data by using curve fitting.

As has been illustrated by the way of examples above, the amount of correction that is needed depends on the amount of data and the degree of confidence desired. To facilitate such an exercise, the Mat lab code that was used to generate FIGS. 4-7 is provided hereinbelow.

k=1;
N=1e4; % Number of samples collected for the statistic for sigma=0.02:1/100:1
Quadrant=sign(randn(N, 1))+j*sign(randn(N, 1)); % Generate 4 QAM signal points
data=sigma*(randn(N, 1)+j*randn(N, 1))+Quadrant; % Received data is signal plus noise with the variance parameter sigma
% demodulate data
hd=sign(real(data))+j*sign(imag(data)); % hard 4-QAM decisions

```
% use hard decisions to calculate SNR
% Anything outside the constellation is an erasure. Count the
% number of erasures, and adjust the SNR calculation accordingly.
erasures1=find(abs(real(data))>2);
erasures2=find(abs(imag(data))>2);
hd(erasures1)=0;
hd(erasures2)=0;
data(erasures1)=0;
data(erasures2)=0;
Scnt=length(find(hd==0)); % Total number of erasures
Var=sum((data-hd).*conj(data-hd))/(2*(N-Scnt));
actualS(k)=sigma; % Remember the actual value of sigma, so that we can make plots later on
Sigma(k)=sqrt (Var); % This is the calculated value
k=k+1
end
SSQ=actualS.^2; % actual Squared variance
CSQ=Sigma.^2; % Calculated Squared variance
SNRC=10*log 10(1./CSQ); % Calculated SNR
SNR=10*log 10 (1./SSQ); % Actual SNR
x=CSQ;
% Polynomia fit derived to calculate actual Squared variance from the
% calculated squared variance
% f(x)=p1*x^5+p2*x^4+p3*x^3+p4*x^2+p5*x+p6
p1=2.139e+004;
p2=-2.018e+004;
p3=7443;
p4=-1329;
p5 =115.7;
p6=-3.816;
AdjSQ=p1*x.^5+p2*x.^4+p3*x.^3+p4*x.^2+p5.*x+p6
AdjSQ(1:40)=CSQ(1:40); % if the variance is small we do not apply the adjustment
AdjSNR=10*log 10(1./AdjSQ);
FIG. (5)
hold off
plot (actualS, SNR)
hold on
plot (actualS, SNRC, 'r')
% plot (Adj SNR, 'g')
xlabel ('Actual Variance');
ylabel ('SNR in dB');
legend ('Actual SNR', 'Calculated SNR');
FIG. (6)
hold off
plot (Sigma, actualS)
xlabel ('Calculated variance')
ylabel ('Actual Variance')
grid
FIG. (7)
hold off
plot (actualS, SNR)
hold on
plot (actualS, SNRC, 'r')
plot (actualS, AdjSNR, 'g')
xlabel ('Actual Variance');
ylabel ('SNR in dB');
legend ('Actual SNR', 'Calculated SNR', 'Adjusted SNR');
% Monte carlo simulation for the case when only a small number of data
% points are available. Ad the variance increases, we see higher % variability in SNR estimation.
k=1;
N=256;
for sigma=0.02:1/100:1
    for i=1:1000% simulate each case a thousand times so that we can look at the variability in estimation
        Quadrant=sign (randn(N, 1))+j*sign(randn(N, 1));
        data=sigma*(randn(N, 1)+j*randn(N, 1))+Quadrant;
        % demodulate data
        hd=sign(real(data))+j*sign(imag(data));  % hard 4-QAM decisions
        % use hard decisions to calculate SNR
        % anything outside the constellation is an erasure. Count the
        % number of erasures, and adjust the SNR calculation accordingly.
        erasures1=find (abs(real(data))>2);
        erasures2=find (abs(imag(data))>2);
        hd(erasures1)=0;
        hd(erasures2)=0;
        data(erasures1)=0;
        data(erasures2)=0;
        Scnt=length(find(hd==0));
        Var=sum((data-hd).*conj(data-hd))/(2*(N-Scnt));
        actualS (i, k)=sigma; %
        Sigma(i, k)=sqrt(Var);
    end
    k=k+1
end
FIG. (8)
hold off
plot (Sigma, actualS (1,:), 'g.')
xlabel ('Calculated Sigma')
ylabel ('Actual Sigma')
step=1/200;
percentile=90;
k=1;
% Calculate the percentile confidence points by making a histogram
for sigma=0.02:2*step:0.52
    list=find (Sigma>sigma-step & Sigma<sigma+step);
    TmpActualS=sort(actualS (list));
    Index=round (length (TmpActualS)*percentile/100);
    percentileS (k)=TmpActualS (Index);
    CalculatedS (k)=sigma;
    k=k+1;
end
hold on
plot (CalculatedS, percentileS, 'k.')
SSQ=actualS.^2;
CSQ=Sigma.^2;
SNRC=10*log 10(1./CSQ);
SNR=10*log 10(1./SSQ);
FIG. (9)
hold off
plot (actualS, SNRC, 'r.')
hold on
plot (actualS, SNR, 'k.')
xlabel ('Actual Variance');
ylabel ('SNR in dB');
p1=97.27;
p2=-100.4;
p3=38.52;
p4=-6.633;
p5=1.543;
p6=-0.01304;
x=Sigma;
x=p1*x.^5+p2*x.^4+p3*x.^3+p4*x.^2+p5*x+p6;
AdjSQ=x.^2;
```

SNRadj=10*log 10(1./AdjSQ);
plot(actualS, SNRadj, 'y');
legend ('Actual SNR', 'Calculated SNR', 'Adjusted SNR');

Note that the numerator in the SNR equation is the signal strength. When the signal is properly normalized to set the lattice size to unity, the signal strength for typical QAM lattices increase by around 3 dB for each additional bit. Therefore, for a high order constellation, adjustments will be needed even at relatively high SNR. What is essentially of interest here is the Target BER and the noise margin that shall determine the need and the amount of adjustment.

The current ADSL testing standard requires 6 dB of noise margin. However, due to low take-rates (the rate at which customers subscribe to DSL service when it is available), and a desire to provide higher data rates to a larger customer population, several service providers wish to push the limits of the system for the long loops. This in turn could be achieved by sending bits even on channels that have relatively low SNR, while making such that we do not run into estimation problems. ADSL2 standard provides for mechanisms to combine to low SNR channels, in order to get sufficient capacity to send data. In this case, again, robust accurate measurement of SNR shall play an important role in achieving those objectives. The invention presents one such method, which can be tuned for reliability by choosing confidence levels, and at the same time, does not need too much computation or memory.

While a preferred embodiment of the present invention is shown and described, it is envisioned that those skilled in the art may devise various modifications of the present invention without departing from the spirit and scope of the appended claims. For example, the curve fitting could be performed on the calculated SNR, or the square of the variance. The method could also be applied to other communication systems such as satellite communication or optical communication.

The invention is claimed as follows:

1. A computer readable medium encoded with instructions capable of being executed by a computer to perform a method of curve fitting; the instructions causing the computer to:
   a.) define a predetermined limit of a calculated variance;
   b.) collect data having said calculated variance;
   c.) apply a correction factor to said calculated variance every time said calculated variance is more than said pre-determined limit; and
   d.) derive a true variance of the data by using curve-fitting;
   wherein said predetermined limit of said calculated variance depends on the accuracy with which it is desired to measure a SNR (signal-to-noise-ratio), as well as computational resources available.

2. A method as defined in claim 1, wherein said curve fitting used is performed by table lookup.

3. A method as defined in claim 1, wherein said curve fitting used is performed by spines.

4. A method defined in claim 1, wherein said curve fitting used is performed by polynomial curve fitting.

5. A method defined in claim 4, wherein polynomial curve fitting is applied to said calculated variances that are above 0.4.

6. A method defined in claim 1, further comprising collecting ten thousand points of data.

7. A method as defined in claim 1, further comprising collecting two hundred fifty-six points of data.

* * * * *